(12) United States Patent
Mikladal

(10) Patent No.: US 12,291,447 B2
(45) Date of Patent: May 6, 2025

(54) APPARATUSES COMPRISING FILMS WITH FREE-STANDING REGION

(71) Applicant: Canatu Oy, Vantaa (FI)

(72) Inventor: Bjørn Mikladal, Helsinki (FI)

(73) Assignee: CANATU OY, Vantaa (FI)

( * ) Notice: Subject to any disclaimer, the term of this patent is extended or adjusted under 35 U.S.C. 154(b) by 820 days.

(21) Appl. No.: 16/762,708

(22) PCT Filed: Nov. 8, 2018

(86) PCT No.: PCT/FI2018/050822
§ 371 (c)(1),
(2) Date: May 8, 2020

(87) PCT Pub. No.: WO2019/092318
PCT Pub. Date: May 16, 2019

(65) Prior Publication Data
US 2021/0171341 A1    Jun. 10, 2021

(30) Foreign Application Priority Data

Nov. 8, 2017 (FI) .................................... 20176000

(51) Int. Cl.
*B82B 3/00* (2006.01)
*B01D 63/08* (2006.01)
(Continued)

(52) U.S. Cl.
CPC ............ *B82B 3/0066* (2013.01); *B01D 63/08* (2013.01); *B01D 63/081* (2013.01);
(Continued)

(58) Field of Classification Search
CPC ....... B82B 3/0066; B82B 3/00; B01D 63/081; B01D 67/0088; B01D 69/06;
(Continued)

(56) References Cited

U.S. PATENT DOCUMENTS 3,933,643 A * 1/1976 Colvin ............... B01D 39/2013
55/498
5,264,137 A * 11/1993 McCullough, Jr. ........................
G01N 27/44747
210/243

(Continued)

FOREIGN PATENT DOCUMENTS

CN        101400597 A    4/2009
JP        2010093805 A    4/2010
(Continued)

OTHER PUBLICATIONS

Cadarso, Víctor J., et al. "High-aspect-ratio nanoimprint process chains." Microsystems & nanoengineering 3.1 (2017): 1-12. (Year: 2017).*

(Continued)

*Primary Examiner* — Mark F. Huff
*Assistant Examiner* — Moriah S. Smoot
(74) *Attorney, Agent, or Firm* — Robert P. Michal, Esq.; Carter, DeLuca & Farrell LLP

(57) ABSTRACT

An apparatus, comprising a film (103) comprising a network of conductive and/or semi-conductive high aspect ratio molecular structures is presented. The apparatus also comprises a frame (102) arranged to support the film (103) at least at least two support positions so that a free-standing region (101) of the film (103) extends between the at least two support positions. The two or more electrical contact areas electrically coupled to the film (103), and these electrical contact areas are arranged to pass electric charge across the free-standing region (101) of the film (103) at a current between 0.01 and 10 amperes.

16 Claims, 4 Drawing Sheets

(51) Int. Cl.

| | |
|---|---|
| *B01D 67/00* | (2006.01) |
| *B01D 69/06* | (2006.01) |
| *B01D 69/10* | (2006.01) |
| *B01D 71/02* | (2006.01) |
| *B82Y 15/00* | (2011.01) |
| *B82Y 20/00* | (2011.01) |
| *B82Y 30/00* | (2011.01) |
| *B82Y 40/00* | (2011.01) |
| *G03F 1/62* | (2012.01) |
| *H01K 1/06* | (2006.01) |
| *H01K 1/16* | (2006.01) |
| *H01S 3/067* | (2006.01) |
| *H01S 3/1115* | (2023.01) |

(52) U.S. Cl.
CPC ......... *B01D 67/0088* (2013.01); *B01D 69/06* (2013.01); *B01D 69/10* (2013.01); *B01D 71/0212* (2022.08); *G03F 1/62* (2013.01); *B01D 2313/345* (2013.01); *B82Y 15/00* (2013.01); *B82Y 20/00* (2013.01); *B82Y 30/00* (2013.01); *B82Y 40/00* (2013.01); *H01K 1/06* (2013.01); *H01K 1/16* (2013.01); *H01S 3/067* (2013.01); *H01S 3/1115* (2013.01)

(58) Field of Classification Search
CPC ............ B01D 71/021; B01D 2313/345; B01D 63/08; B01D 69/10; G03F 1/62; B82Y 15/00; B82Y 20/00; B82Y 30/00; B82Y 40/00; H01K 1/06; H01K 1/16; H01K 1/14; H01K 11/00; H01K 1/04; H01S 3/067; H01S 3/1115; H04R 2307/023; H04R 23/002; H01B 1/04; H01B 5/16; G10K 15/04; B81C 99/0075; H10K 99/00
See application file for complete search history.

(56) References Cited

U.S. PATENT DOCUMENTS

| | | | | |
|---|---|---|---|---|
| 7,813,108 B2 * | 10/2010 | Liu | ............ | H01G 11/36 |
| | | | | 361/519 |
| 8,389,058 B2 * | 3/2013 | Liu | ............ | C01B 32/158 |
| | | | | 427/444 |
| 10,355,229 B2 * | 7/2019 | Lieber | ............ | G01N 27/4146 |
| 2004/0108298 A1 * | 6/2004 | Gao | ............ | B82Y 10/00 |
| | | | | 216/13 |
| 2009/0308753 A1 * | 12/2009 | Wong | ............ | C25D 7/04 |
| | | | | 205/83 |
| 2010/0086150 A1 * | 4/2010 | Jiang | ............ | H04R 23/002 |
| | | | | 381/164 |
| 2010/0270911 A1 * | 10/2010 | Liu | ............ | B82Y 40/00 |
| | | | | 423/445 B |
| 2011/0097512 A1 * | 4/2011 | Zhou | ............ | H01B 1/04 |
| | | | | 977/932 |
| 2011/0256451 A1 | 10/2011 | Cui et al. | | |
| 2012/0021191 A1 * | 1/2012 | Brown | ............ | B81C 99/0085 |
| | | | | 977/734 |
| 2013/0209807 A1 | 8/2013 | Chatterjee | | |
| 2016/0091787 A1 | 3/2016 | Kirkpatrick et al. | | |
| 2016/0097941 A1 | 4/2016 | Feng et al. | | |
| 2017/0312781 A1 * | 11/2017 | Wei | ............ | B05B 7/1686 |

FOREIGN PATENT DOCUMENTS

| | | | |
|---|---|---|---|
| JP | 2012516277 A | 7/2012 | |
| JP | 2012205198 A | 10/2012 | |
| JP | 2015535743 A | 12/2015 | |
| JP | 2017051384 A | 3/2017 | |
| TW | 201029916 A | 8/2010 | |
| TW | 201203041 A | 1/2012 | |
| WO | 2007061945 | 5/2007 | |
| WO | 2010086504 | 8/2010 | |
| WO | WO-2010086504 A1 * | 8/2010 | ......... B81C 99/0085 |

OTHER PUBLICATIONS

Anoshkin, Ilya V., et al. "Single-walled carbon nanotube networks for ethanol vapor sensing applications." Nano Research 6 (2013): 77-86. (Year: 2013).*
Li, Zheng, et al. "Superstructured assembly of nanocarbons: fullerenes, nanotubes, and graphene." Chemical reviews 115.15 (2015): 7046-7117. (Year: 2015).*
Agilent 34401A Multimeter Uncompromising Performance . . . , Aug. 31, 2016, wp.optics.arizona.edu/mnofziger/wp-content/uploads/sites/31/2016/08/Pages-from-HP34401Man.pdf. (Year: 2016).*
FI Application No. 2017600, "Search Report", Apr. 25, 2018, 2 pages.
International Application No. PCT/FI2018/050822, "International Search Report and Written Opinion", Jan. 31, 2019, 11 pages.
Nasibulin et al., "Multifunctional Free-Standing Single-Walled Carbon Nanotube Films", American Chemical Society, vol. 5, No. 4, 2011, pp. 3214-3221.
JP 2020-524035, "Notice of Reasons for Rejection" mailed Nov. 8, 2022, 7 pages.

* cited by examiner

APPARATUSES COMPRISING FILMS WITH FREE-STANDING REGION

CROSS-REFERENCE TO RELATED APPLICATIONS

The present application is a U.S. national phase application under 35 U.S.C. § 371 of PCT/FI2018/050822, filed on Nov. 8, 2018, which claims the benefit of priority to FI application No. 20176000, filed Nov. 8, 2017, the entire contents of each of which are incorporated by reference herein for all purposes.

FIELD OF THE INVENTION

The present invention relates to thin film technology. In particular, the invention relates to apparatuses comprising films with high aspect ratio molecular structures.

BACKGROUND OF THE INVENTION

High-aspect ratio molecular structures (HARM-structures) such as carbon nanotubes (CNTs) or other nanoscale structures with high-aspect ratio possess unique electrical, optical, thermal and mechanical properties, which make them a promising material for many applications.

Films that comprise high aspect ratio molecular (HARM) structures described above may include a standalone, or free-standing, portion that can be useful in various applications. The free-standing portions of the film are sensitive to fluctuations in air pressure or thermal radiation pressure. Under this pressure, the film can rupture and lose its function. Furthermore, a free-standing HARM-structure network tends to start sagging or hanging after prolonged periods of use, because gravity and small air fluctuations can slowly pull the structures apart.

SUMMARY OF THE INVENTION

The apparatus according to the present invention is characterized by what is presented in independent claim 1.

The method according to the present invention is characterized by what is presented in independent claim 15.

According to a first aspect of the present invention, an apparatus is presented. The apparatus comprises: a film comprising a network of conductive and/or semi-conductive high aspect ratio molecular structures, HARM-structures, a frame arranged to support the film at least at two support positions so that a free-standing region of the film extends between the at least two support positions, and two or more electrical contact areas electrically coupled to the film. The two or more electrical contact areas are arranged to pass electric charge across the free-standing region of the film at a current between 0.01 and 10 amperes.

The frame according to the first aspect may be part of a substrate on which the film comprising a network of HARM-structures is manufactured. Alternatively, the film may be placed on the frame after it was manufactured. The frame may support the film at least at two positions to form a free-standing standalone region where the film comprising HARM-structures is formed. The support positions may be located anywhere in the structure as long as they provide sufficient support for the film. For example, they may be on the sides of the film, or in areas near corners, or next to each other along one side forming a "flag pole". By "at least two" support positions are meant at least two points of contact on which the frame supports the film. Any wider area that includes a plurality of support points is also meant to be covered by this aspect, for example if the frame has an uninterrupted circular shape wherein the free-standing region lies within the circle. The frame may also have any other prolonged uninterrupted shape according to the first aspect. The frame can be made of any suitable material, such as plastic, glass, metal, wood, textile etc.

The two or more electrical contact areas are arranged to pass electric charge across the free-standing region of the film. The electrical contact areas are made of a conductive material and can have a shape that produces a uniform response from the whole free-standing region of the film. This may be provided by the electrical contact areas having a size that matches or exceeds the characteristic size of the free-standing region. The current between 0.01 ampere and 10 amperes is sufficient to provide a magnetic attraction between the HARM-structures in the network. This provides a technical effect of preventing sagging and increasing the tension in the film, making it flat as originally disposed.

In an embodiment of the first aspect, the two or more electrical contact areas are arranged to pass electric charge across the free-standing region of the film at a current between 0.01 and 0.7 amperes. This range can be sufficient for most films comprising HARM-structures that are commonly used. In other embodiments, the electrical charge can be passed across the free-standing region of the film at a current between 0.01 and 2.3 amperes. This range of currents may be useful for films with a free-standing region of relatively large area.

The applied current may also cause heat in the film through resistive heating. The indicated upper limit of 10 A for the current prevents relatively thick films from burning of resistive heating. With films that are thinner, the upper limit of 0.7 A can be sufficient for the purpose and also prevent the film from burning of resistive heating. A free-standing region of the film may also provide better heat emission than other structures wherein HARM-structures are on a silicon layer where heat is dissipated through the substrate.

In an embodiment of the first aspect, the apparatus comprises two or more electrodes electrically coupled to the film at two or more peripheral locations. The two or more electrical contact areas are provided in, or via, the two or more electrodes, and the two or more electrodes are shaped to pass electric charge across the whole free-standing region of the film.

The electrodes may be shaped to surround the film or have a geometry that allows the electrical charge to pass through the whole free-standing region. The electrodes can be applied to the frame before the film is deposited, but can also be painted afterwards. In this embodiment, the two or more electrodes may be attached to the frame at a position which allows them to be in electrical contact with the film. Alternatively, the electrodes may only be electrically connected to the film and not attached to the frame.

In an alternative embodiment, the frame can comprise an electrically conductive material and a non-conductive area separating the electrically conductive material into at least two conductive areas. The two or more electrical contact areas are provided in the conductive areas of the frame. This way the frame itself can be configured to serve as contact, which makes the structure easier to manufacture with fewer parts.

In an embodiment, the two or more electrical contact areas are arranged to pass an electric charge across the free-standing region of the film in pulses at a frequency between 0 hertz (Hz) and 20 kilohertz (kHz).

The pulses may be of alternating current or of direct current. The range starts at 0 since in some applications, a single pulse can provide enough tension for the film to last hours or days before the current needs to be applied again. Alternatively, the electrical contact areas can be arranged to provide short bursts of pulses at a predetermined frequency sufficient to restore or keep up tension in the film. The pulsed operating mode can be advantageous because it lets the film cool down between pulses, avoiding overheating and using less power. The upper limit of 20 kHz covers the range that can be registered by human ear, and higher frequencies of this range can be used for applications in thermoacoustic speakers. In most applications, the frequency is below 3 kHz.

In alternative embodiments, current can be applied continuously over the lifetime of the free-standing region of the film.

In an embodiment, the film comprises a network of essentially randomly oriented HARM-structures. The randomly oriented HARM-structures are likely to have no preferred current direction; hence the electrical contact areas may be provided on any side of the free-standing region. The random orientation of individual molecules can have advantageous effects to the properties of the network of HARM-structures. These effects include, but are not limited to, high electrical and thermal conductivity, isotropic electrical and thermal conductivity, good mechanical stability and durability, high uniformity in thickness and in porosity, large surface area and chemical reactivity, good solid, thermal, electrical, optical and fluid mechanical isotropy.

In an alternative embodiment, the HARM-structures in the film are oriented substantially in the same direction, and the electrical contact areas are electrically coupled to the film such that the direction of the electric current in the free-standing region of the film is substantially parallel to the orientation of the HARM-structures. An example of a structure with such orientation is buckypaper where the Carbon Nanotubes (CNTs) are aligned. This placement of electrical contact areas provides higher efficiency when passing a current to increase or restore tension in the film. In other embodiments, the electrical contact areas can be electrically coupled to the film such that the direction of the electric current in the free-standing region of the film is at an angle to the orientation of the HARM-structures.

In an embodiment, the frame is arranged to support the film along the perimeter of the free-standing region. As mentioned above in relation to the first aspect, the support positions may be uninterrupted and spread across an area of the film. Supporting the free-standing region along the perimeter provides freedom of positioning for electrical contact areas at any side of the region, and provides generally reliable support. This naturally eases implementation of the apparatus e.g. in filters where enclosed free-standing regions are used.

In an embodiment, the HARM-structures are selected from the group of: carbon nanotube (CNT) molecules, carbon nanobud (CNB) molecules, graphene ribbons, and carbon (graphite) fiber filaments. Carbon nanotube molecules include single-walled nanotubes, double-walled nanotubes and other molecules formed of nanotubes. Carbon nanobud molecules include a carbon nanotube attached to a fullerene by covalent bonding.

In an embodiment, the film has a thickness between 1 nanometer and 10 micrometers. The electrical current passed through a film of this thickness according to the first aspect is sufficient to create tension in the free-standing region. The film may also vary in size and density of HARM-structures, depending on the implementation.

In one implementation of the first aspect, an air filter can comprise the apparatus of any one of the above embodiments.

In another implementation of the first aspect, a liquid environment filter can comprise the apparatus of any one of the above embodiments.

By the air and liquid environment filters are meant any particle filters through which air or liquid is passed.

In another implementation of the first aspect, a pellicle for a photomask can comprise the apparatus of any one of the above embodiments.

A pellicle can be a thin, transparent membrane that covers a photomask during the production flow. The pellicle can act as a dust cover, as it prevents particles and contaminates from falling on the mask. It is transparent enough to allow light to transmit from the lithography scanner to the mask.

The film comprising HARM-structures with a free-standing region can be useful in pellicles for photomasks because it has a porous structure. The free-standing region has no substrate underneath so it can be more transparent to light.

In other implementations, the apparatus according to the first aspect can be used in light detectors, absorbers, lasers and any other device or structure that may benefit from using a film with a free-standing region. The apparatus according to the first aspect can also be used in sensors, wherein the free-standing region is used as a sensing element.

One application of the films with free-standing regions is a thermal emitter, and the apparatus according to the present invention can prolong the lifetime of such thermal emitter. The emitter may be configured to apply heat by resistive heating of the free-standing region.

According to a second aspect, a method for maintaining a free-standing region of a film comprising a network of HARM-structures is presented. The method comprises: electrically coupling the film to two or more electrodes at two or more peripheral locations of the film, and passing electric charge across the free-standing region of the film at a current between 0.01 and 10 Amperes.

Like the first aspect, a current in this range is sufficient to create a magnetic attraction between the HARM-structures in the network, and therefore tension in the free-standing region of the film.

In an embodiment of the second aspect, the electric current is applied across the free-standing region of the film in pulses of a length between 0.05 ms and 1000 ms or more and at a frequency between 0 Hz and 20 kHz.

In an embodiment the method further comprises modifying the film comprising a free-standing region, or the free-standing region of the film only, with a polymer, metal or metal oxide coating. These coatings can modify or improve the mechanical, optical, thermal or electrical properties of the film. In other embodiments the film may be coated with metals, salts or semiconducting compounds. The coatings may be used for example to increase heat dissipation and durability against chemicals.

In mechanical filtering applications, such as particle or gas filters, the apparatus and method according to the present invention provide the advantage of good functionality and renewability.

Sensor applications with a network of free-standing HARM-structures as the sensing part of the sensor can be highly responsive to surface changes caused by chemical interactions or mechanical forces, and have a large sensing surface area and good sensitivity. The apparatus and method according to the above embodiments can increase the lifetime of the network of free-standing HARM-structures used in sensors.

The apparatus and method according to the present invention can be easy incorporated into various device structures that utilize films with free-standing regions.

The embodiments of the invention described hereinbefore may be used in any combination with each other. Several of the embodiments may be combined together to form a further embodiment of the invention. A product, a method or a use to which the invention is related may comprise at least one of the embodiments of the invention described hereinbefore.

DETAILED DESCRIPTION OF THE INVENTION

In the following, the present invention will be described in more detail with exemplary implementations by referring to the accompanying figures.

The present invention is based on a concept that increased tension in a free-standing region of a film comprising HARM-structures can be archived by passing an electric current through it. The attractive force of the magnetic field formed between two substantially parallel current-carrying HARM-structures appears in accordance with Ampere's force law. When two HARM-structures carrying electric current in the same direction are placed within each other's magnetic field they can be physically attracted to each other if the current is sufficient. The electric current passed through a network of parallel HARM-structures is split up between the individual paths, hence the current through an individual HARM-structure is dependent on the number of said HARM-structures, or the density of the film. It may not be possible to know the exact current passing through individual HARM-structures because it may not be feasible to count all the conductive paths in a film or measure the current individually, and therefore the exact force of attraction appearing between two HARM-structures may not be available for measurement. However, for most densities of HARM-structure films used there is a range of currents that, when applied across the film, causes sufficient magnetic attraction between the individual structures. This creates the needed tension in the film. The range of currents is between 0.01 and 10 Amperes. In some of the embodiments, passing current within the range of 0.01 and 0.7 Amperes is sufficient for achieving the technical result. The current required to increase tension in the film can also depend on the aspect ratio and size of the free-standing region of the film. For example, for larger samples where the size of the free-standing region between contacts is approximately 100 millimetres, currents up to 2.3 amperes can be optimal to quickly create tension in the free-standing region.

For reasons of simplicity, item numbers will be maintained in the following exemplary implementations in the case of repeating components.

Figure 1A:
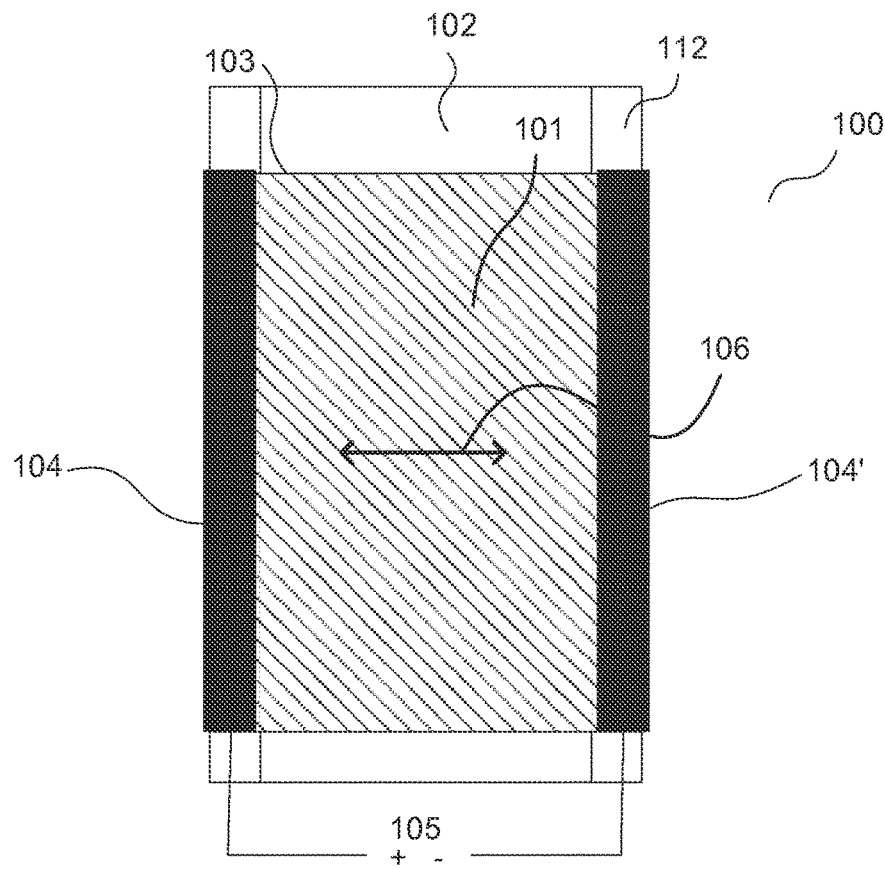
FIG. 1a is an illustration of an apparatus according to an embodiment.
Figure 1B:
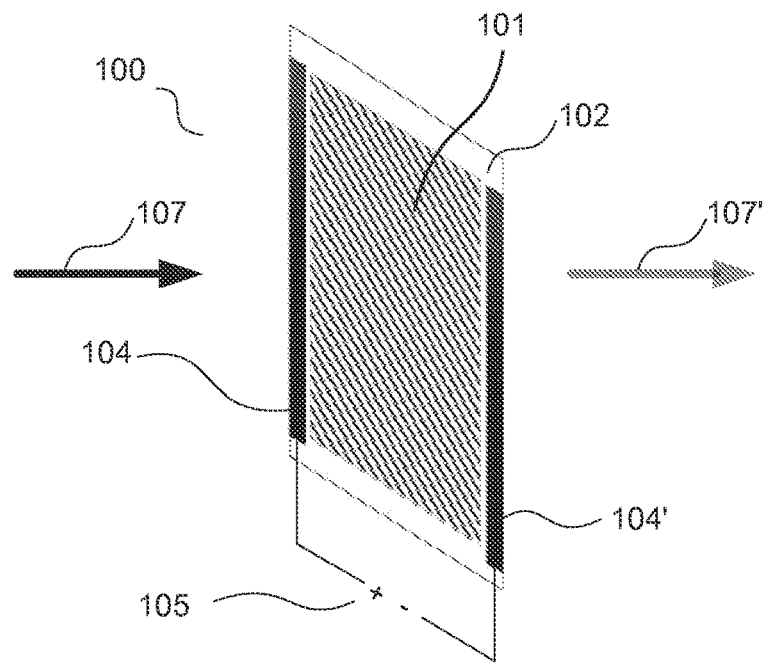
FIG. 1b shows an apparatus according to an embodiment at an angle.

FIGS. 1a and 1b schematically illustrate an apparatus according to an implementation of the invention. FIG. 1a shows a top view of the apparatus 100 comprising a film 103. The film 103 includes a network of conductive and/or semi-conductive HARM-structures, which are indicated by hashed patterns in this and other figures. The apparatus further comprises a frame 102 on which the film 103 is disposed. The frame 102 is arranged to support the film 103 at least at two support positions 112. In the implementation shown on FIG. 1a the support positions 112 are at opposite sides of the film 113, forming a free-standing region 101 that extends between them.

The apparatus 100 also comprises two electrical contact areas marked in black, which in this example are provided in two electrodes 104, 104' positioned at peripheral locations of the film 103 and electrically coupled to it. The electrodes 104, 104' are connected to a power supply 105 and arranged to pass an electric charge across the free-standing region 101 of the film 103 at a current between 0.01 and 10 amperes. The current may be alternating current or direct current. In this example, the electrodes 104, 104' are shaped to pass the electric charge across the whole free-standing region 101 since their geometry matches the shape and size of the free-standing region 101. Like other implementations shown on the remaining figures, the layout of FIGS. 1a-1b is not a limiting configuration, and the shapes of the electrodes 104, 104', frame 102 and free-standing region 101 may be different as long as electric charge is passed across a desired part of the free-standing region. The electrodes 104, 104' may be attached to the frame 102 or coupled to the film 103. The general direction of current in the free-standing region 101 is schematically shown by the arrow 106.

The conductive and/or semi-conductive HARM-structures in the network shown on FIG. 1 may be essentially randomly oriented. Alternatively, the network of HARM-structures may be oriented substantially in the same direction, which in this case would be the direction of the arrow 106. This is because the electrodes 104, 104' are attached to such oriented network of HARM-structures such that the direction 106 of the electric current in the free-standing region 101 of the film 103 is substantially parallel to the orientation of the HARM-structures. The electric charge may be passed across the free-standing region 101 in pulses at a frequency between 0 and 20 kilohertz.

FIG. 1b shows an offset view of an apparatus 100 similar to the apparatus shown in FIG. 1a. This figure generally illustrates filter applications of the apparatus 100 comprising a film 103 supported by a frame 102 which forms a free-standing region 101. Arrow 107 refers to air or any liquid with particles that need to be filtered, and arrow 107' refers to filtered air or liquid without the particles. During operation of any such filter, the free-standing region 101 can lose tension and start sagging because of the forces applied to it by the air or liquid medium passed through it. Gravitational forces may also cause sagging over time. This sagging will reduce the performance and lifetime of the filter. By applying a current at 0.01 to 10 A across the film via the electrodes 104, 104', either continuously or in pulses, tension can be created in the free-standing region 101, causing it to flatten again.

Figure 2:
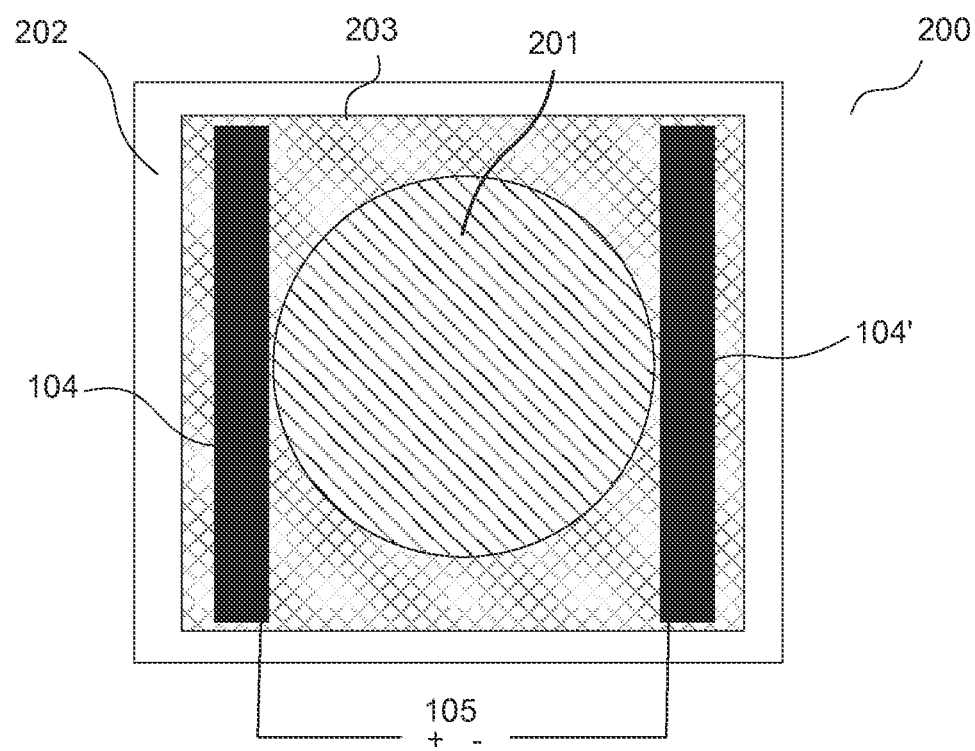
FIG. 2 is an illustration of an apparatus according to a different embodiment.

FIG. 2 is a top view of an apparatus 200 according to another implementation. In this case, the apparatus 200 also comprises a film 203 which includes a network of conductive and/or semi-conductive HARM-structures and has a circular free-standing region 201. The apparatus 200 comprises a frame 202 on which the film 203 is disposed. The frame 202 comprises a circular-shaped gap and supports the film 203 along the perimeter of the circle, thereby forming the circular free-standing region 201.

The apparatus 200 also comprises two electrical contact areas marked in black, which in this example are provided (like in the apparatuses 100 of FIGS. 1a-1b) in two electrodes 104, 104' positioned at peripheral locations of the film 203 and electrically coupled to it. The electrodes 104, 104' are also coupled to the power source 105.

The circular shape of the free-standing region 201 may be used in various applications where it is desirable. In addition, the circular shape provides equal support along the whole perimeter of the free-standing region 201 by the frame 202. Manufacture of apparatuses like the apparatus 200 may be more cost-efficient since it is sufficient to make a circular gap in the substrate (frame 202) at any point of the manufacturing process, and electrodes 104, 104' may be easily positioned at any angle to the free-standing region 201.

Figure 3:
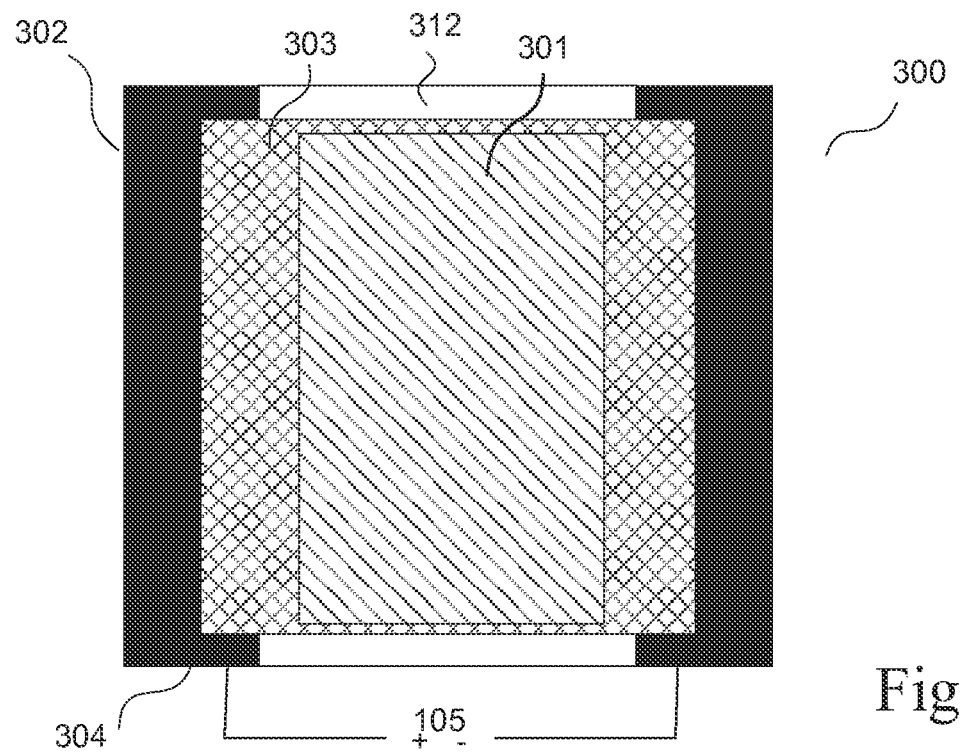
FIG. 3 is an illustration of an apparatus according to another embodiment wherein electrical contacts are provided in the frame.

FIG. 3 illustrates an apparatus 300 according to a further implementation of the invention. The apparatus 300 comprises a film 303 that includes a network of conductive and/or semi-conductive HARM-structures. The apparatus further comprises a frame 302 on which the film 303 is disposed. The frame 302 comprises a rectangular gap and is arranged to support the film 303 along the perimeter of the rectangle, thereby forming a rectangular free-standing region 301. The rectangular shape is used here as an example only, and it illustrates that the free-standing region 301 of the film 303 may be of any shape in different implementations of the invention.

In this implementation, the frame 302 comprises an electrically conductive material which forms conductive areas 304 of the frame. Two or more electrical contact areas 304 are provided in the conductive areas 304 of the frame 302. In this case, the support positions are uninterrupted and enclose the free-standing region 301 along its perimeter. The conductive areas 304 are separated by a non-conductive area 312 of the frame 302 to allow the electrical charge to pass through the free-standing region 301. As the frame itself provides the electrical contact, it is connected directly to the power supply 105.

Figure 4:
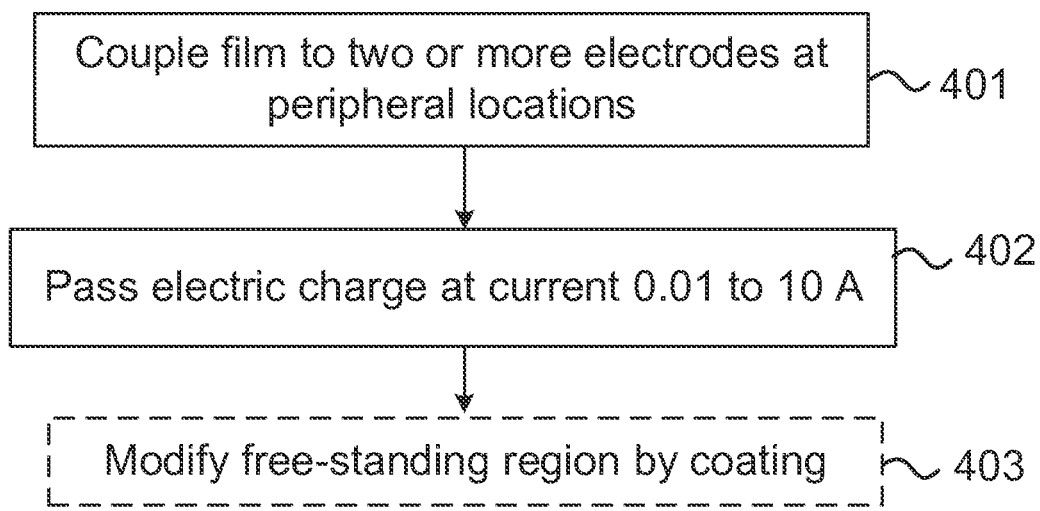
FIG. 4 is a block diagram of a method according to an aspect.

FIG. 4 is a block diagram of a method for maintaining a free-standing region of a film comprising a network of HARM-structures according to an aspect. The method comprises electrically coupling 401 the film to two or more electrodes at two or more peripheral locations of the film. The electrodes may be coupled in any suitable way that allows passing of current through the desired areas of the film. For example, the electrodes may be coupled as shown in FIGS. 1a, 1b and 2. The method further comprises passing 402 an electric charge across the free-standing region of the film at a current between 0.01 and 10 amperes. This creates a magnetic attraction between the HARM-structures as described above, leading to an increase in tension of the free-standing region of the film comprising a network of said HARM-structures. In turn, this results in improved durability and lifetime of the free-standing region and the film in general. The "maintenance" of the films provided by this method may be performed frequently, automatically or started manually when needed, depending on the application. The electric current may be applied across the free-standing region of the film in pulses of a length between 0.05 and 1000 milliseconds, and at a frequency between 0 and 20 kHz. If a higher current is needed for the film comprising a free-standing region, the pulses may be necessary to prevent unwanted overheating of the electrodes, film and external environment. The method may also comprise modifying 403 the free-standing region of the film with a polymer, metal or metal oxide coating to further improve the properties of the film.

Figure 5:
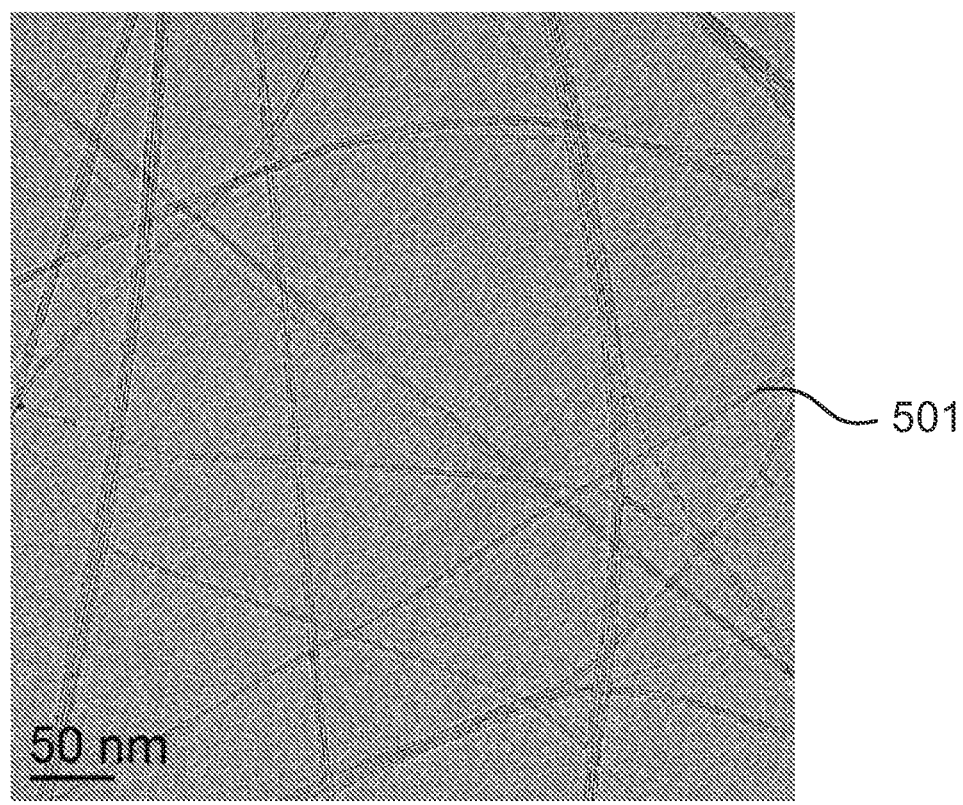
FIG. 5 is an image generated by a Transmission Electron Micrograph (TEM) of a network of carbon nanotubes.

FIG. 5 is a snapshot taken by a high magnification Transmission Electron Micrograph (TEM) of carbon nanobuds (CNBs) 501 from a free-standing region of a low-density film. In this example, the CNBs in the network are aligned randomly, and any individual CNB 501 may have many different neighbouring nanobuds at various locations along its length, and have varying distance between them. A current at approximately 0.5 A creates magnetic attraction between the CNBs 501 to create tension in the film illustrated in FIG. 5. Other example experiments and implementations are provided in the section below.

Figure 6:
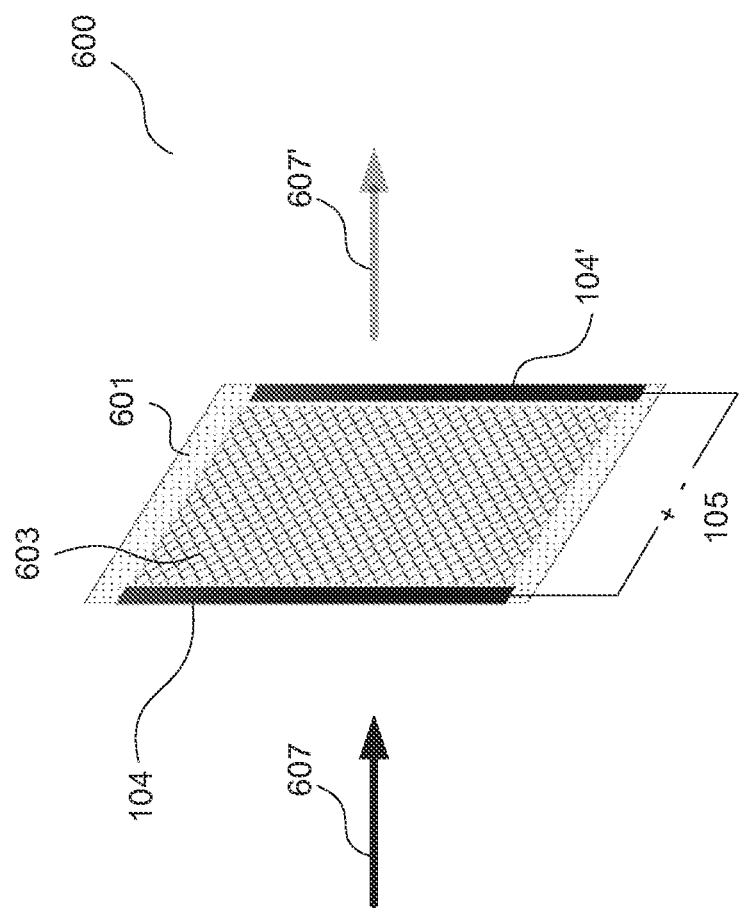
FIG. 6 shows an apparatus according to an embodiment comprising a mesh.

FIG. 6 illustrates an implementation wherein the apparatus 600 is used as a filter. FIG. 1b shows an offset view of an apparatus 100 similar to the apparatus shown in FIG. 1b. The apparatus 600 comprising a film with a free-standing region 603 which is supported by a non-conductive mesh 601. Arrow 607 refers to air or liquid with particles that need to be filtered, and arrow 607' refers to filtered air or liquid without the particles. By applying a current at 0.01 to 10 A across the film via the electrodes 104, 104', either continuously or in pulses, tension can be created in the free-standing region 603, causing it to flatten.

In this setup, the support mesh 601 gives the free-standing film higher durability against large changes in pressure and limits propagation of film defects to the individual mesh openings.

EXAMPLES

An example of a Carbon nanobud (CNB) film used in experiments can be specified by the following properties:
Light transmittance at 550 nm: 86.5%;
Sheet resistance: 252 ohm/square (not doped) and 100 ohm/square (p-doped);
CNB film size: 30×33 mm;
Free-standing region: 5.309 cm^2 (26 mm diameter circle).

The CNB film was supported by a polyethylene terephthalate (PET) substrate with a circular hole (gap) covered by a free-standing region of CNB film. Silver contacts were attached to the edge of the supported CNB film. As a result, for non-doped films, at currents close to 48 mA (DC) the first sign of tension of the free-standing film was observed and above that the magnitude and speed of tension and flattening increased. At 80 mA the film restored its tension and smoothness within approximately 6 seconds depending on its condition. At approximately 100 mA (DC) the film regained tension and smoothness within 3 second, and above 120 mA the film regained tension and smoothness quicker than in 1 second.

Filters

Due to high porosity and strength, randomly oriented freestanding CNT or CNB films can be utilized as aerosol, air or fluid filters. For that purpose, the film can be attached to a frame with a hole to cover the hole completely. In this case particles can be captured by passing the flow through the film. The sagging and potential tearing of the film can be delayed and/or prevented by using the invention according to above embodiments. The pore size between the HARMS-structures can also be adjusted by passing the electrical charge across the free-standing region according to the embodiments, so that the filter efficiency can be controlled on demand Incandescent Lamp CNT or CNB films with free-standing regions can be used as a filament in an Incandescent lamp. To obtain light, a film of HARM-structures can be hanging between two tungsten wires and resistively heated up to 1200-1400 C using either direct or alternating current. Due to their random orientation, and many interconnects, the may remain intact even at 1400 C and the emitted light may remain uniform over the entire film. The film can become worn and deformed as the light source of the incandescent lamp. The apparatus and method according to aspects of the invention can significantly slow down the wear, and prevent sagging of the filament when it is not in use.

Saturable Absorber

Another use of the SWNT films with free-standing regions is as a laser component-saturable absorber. A key element in the mode-locked fiber laser cavity is the nonlinear element initiating the pulsed operation. Embodiments of the present invention allow maintaining the flatness and tension of the free-standing region in such absorbers.

Chemical Sensor

Another application of the CNT or CNB film with free-standing region can be found in electroanalysis as an electrode material. Due to their unique properties such as high conductivity, surface area, electrochemical stability, low background currents and electrocatalytic properties, CNTs or CNBs can be used for electrochemical sensing as electrodes. The lifetime of such electrodes e.g. for electrochemical detection of glucose and dopamine can be prolonged by using the apparatus according to embodiments. Apart from maintenance of the free-standing region in the chemical sensor, embodiments can be used to heat up the sample by passing the electric charge, thereby cleaning the sensor by evaporating the chemicals being studied.

As it is clear to a person skilled in the art, the invention is not limited to the examples described above but the embodiments can freely vary within the scope of the claims.

The invention claimed is:

1. An apparatus, comprising:
   a thin film comprising a network of conductive and/or semi-conductive high aspect ratio molecular structures (HARM-structures), wherein the thin film has a thickness between 1 nanometer and 10 micrometers,
   a frame arranged to support the thin film in at least two support positions so that a freestanding region of the thin film extends between the at least two support positions, two or more electrical contact areas electrically coupled to the thin film,
   wherein the two or more electrical contact areas are arranged and configured to pass electric charge across an entirety of the free-standing region of the thin film at a current between 0.01 and 10 amperes to provide magnetic attraction between the HARM-structures in the network, increasing tension and preventing sagging in the thin film.

2. The apparatus of claim 1, wherein the two or more electrical contact areas are arranged to pass electric charge across the free-standing region of the thin film at a current between 0.01 ampere and 0.7 amperes.

3. The apparatus of claim 1, comprising two or more electrodes electrically coupled to the thin film at two or more peripheral locations, wherein the two or more electrical contact areas are provided in the two or more electrodes, and the two or more electrodes are shaped to pass electric charge across an entirety of the free-standing region of the thin film.

4. The apparatus of claim 3, wherein the two or more electrodes are attached to the frame.

5. The apparatus of claim 1, wherein the frame comprises an electrically conductive material and a non-conductive area separating the electrically conductive material into at least two conductive areas, and wherein the two or more electrical contact areas are provided in the conductive areas of the frame.

6. The apparatus of claim 1, wherein the two or more electrical contact areas are arranged to pass an electric charge across the free-standing region of the thin film in pulses at a frequency between 0 and 20 kilohertz.

7. The apparatus of claim 1, wherein the thin film comprises a network of essentially randomly oriented HARM-structures.

8. The apparatus of claim 1, wherein the HARM-structures in the thin film are oriented substantially in the same direction, and the electrical contact areas are electrically coupled to the thin film such that a direction of the current in the free-standing region of the thin film is substantially parallel to an orientation of the HARM-structures.

9. The apparatus of claim 1, wherein the frame is arranged to support the thin film along a perimeter of the free-standing region.

10. The apparatus of claim 1, wherein the HARM-structures are selected from the group consisting of: carbon nanotube molecules, carbon nanobud molecules, graphene ribbons, carbon (graphite) fiber filaments.

11. The apparatus of claim 1, wherein the free-standing region (101) is coated with a polymer, metal or metal oxide coating.

12. An air filter comprising the apparatus of claim 1.

13. A liquid environment filter comprising the apparatus of claim 1.

14. A pellicle for a photomask comprising the apparatus of claim 1.

15. A sensor comprising the apparatus of claim 1, wherein the free-standing region is used as a sensing element.

16. The apparatus of claim 1, wherein the two or more electrical contact areas are arranged and configured to pass the electric charge across the freestanding region of the thin film to increase or restore tension within the thin film.

* * * * *